United States Patent [19]
Tsuzuki et al.

[11] Patent Number: 6,114,185
[45] Date of Patent: Sep. 5, 2000

[54] WELDING PROCESS AND PHOTOVOLTAIC DEVICE

[75] Inventors: Koji Tsuzuki, Ikoma; Ippei Sawayama, Machida; Yoshimitsu Hayashi, Yokosuka; Yoshifumi Takeyama, Kyoto, all of Japan

[73] Assignee: Canon Kabushiki Kaisha, Tokyo, Japan

[21] Appl. No.: 09/140,680

[22] Filed: Aug. 26, 1998

[30] Foreign Application Priority Data

Aug. 29, 1997 [JP] Japan .................................... 9-233774

[51] Int. Cl.[7] .................................................. H01L 21/00

[52] U.S. Cl. .................................. 438/51; 438/48; 438/50

[58] Field of Search ................................. 438/51, 50, 48

[56] References Cited

U.S. PATENT DOCUMENTS

| | | |
|---|---|---|
| 4,340,803 | 7/1982 | Coyle . |
| 5,008,062 | 4/1991 | Anderson et al. . |
| 5,667,596 | 9/1997 | Tsuzuki et al. ............... 136/256 |

*Primary Examiner*—Kevin M. Picardat
*Assistant Examiner*—D. N. Collins
*Attorney, Agent, or Firm*—Fitzpatrick, Cella, Harper & Scinto

[57] ABSTRACT

Laser light having a wavelength where a thin-film semiconductor layer can absorb the laser light is applied on the side of the thin-film semiconductor layer to join a semiconductor-holding member and a metal member by welding. Materials can be joined at a sufficiently high strength and with long term stability especially when a metal member of the same or different type is welded to a conductive substrate which is a part of a photovoltaic device.

17 Claims, 2 Drawing Sheets

WELDING PROCESS AND PHOTOVOLTAIC DEVICE

BACKGROUND OF THE INVENTION

1. Field of the Invention

This invention relates to a welding process and a photovoltaic device. More particularly, it relates to a process for welding i) a semiconductor-holding member having a thin-film semiconductor layer on its surface and ii) a metal member, in particular, welding a conductive substrate of a photovoltaic device and a conductive foil member. It also relates to a photovoltaic device produced by such a welding process.

2. Related Background Art

Photovoltaic devices on which light is made incident to cause an electromotive force are utilized in various scenes. Especially in recent years, as we are getting more concerned with environmental problems, our higher hope is being placed on their application to clean-energy solar cells.

At present, solar cells are roughly grouped into a crystal type making use of single-crystal silicon or polycrystalline silicon, an amorphous type and a compound semiconductor type. Amorphous silicon solar cells can not be equal to crystal type solar cells just on conversion efficiency, but can be made large-area with ease and also have such a great absorptivity coefficient that they can be operated in thin film, having advantageous features the crystal type solar cells do not have. Thus, they are one of solar cells considered promising.

What presently keeps solar cells from spreading is that the solar cells require a high production cost. In order to lower the production cost of solar cells, it is presented to;

(1) efficiently utilize electricity-generating regions;

(2) lessen connecting points to achieve the reduction of connecting-area material cost and the reduction of personnel expenditure for such connection; and (3) lessen expenses for forming photovoltaic layers. From these viewpoints, it is necessary and indispensable to make solar cells of a large area.

FIGS. 1A and 1B are diagrammatic views showing an example of solar cells; FIG. 1A is a diagrammatic plan view as viewed on the light-receiving side, and FIG. 1B a diagrammatic cross-sectional view along the line 1B—1B in FIG. 1A.

A photovoltaic device 100 shown in FIGS. 1A and 1B is made up by superposing a lower electrode layer 103, a semiconductor layer 104 and a transparent electrode layer 105 in order on a substrate 102 of stainless steel or the like. As the transparent electrode layer 105, a transparent conductive film of indium oxide or the like is formed which also serves as a reflection preventive means and a current collection means.

The transparent electrode layer 105 is partly removed in lines as shown by reference numeral 101 (etching lines) in FIG. 1A, using an etching paste containing $FeCl_3$, $AlCl_3$ or the like which is coated by a method such as screen printing followed by heating. The transparent electrode layer 105 is partly removed so that any short which may occur between the substrate 102 and the transparent electrode layer 105 when the periphery of the photovoltaic device is cut away may not adversely affect the effective light-receiving regions of the photovoltaic device.

Collector electrodes 107 are also formed on the surface of the photovoltaic device 100 so that the electric power generated can be collected with good efficiency. In order that the electric power generated at the semiconductor layer 103 can be delivered without loss, the collector electrodes 107 are formed by bonding metal wires (e.g., copper wires coated with carbon paste) onto the transparent electrode layer 105; the wires having been thinly coated with a conductive adhesives. Such copper wires are used in order to lessen current loss by using a material having a high conductivity.

A conductive foil member 108 is further provided as an additional collector electrode for these collector electrodes 107. Beneath the conductive foil member 108, an insulating member 109 is provided in order to ensure the insulation from the etching lines 101 whose performance is not assured.

In the photovoltaic device fabricated in this way, the conductive foil member 108 and substrate 102 function as terminals of both poles, through which the electric power can be delivered.

However, this device alone can not be usually used for the generation of electricity. Usually, a single electricity-generation cell generates too low of voltage, and hence it is necessary to connect devices in series to achieve a high voltage.

FIGS. 2A and 2B illustrate photovoltaic devices connected in series which are constituted of the device shown in FIG. 1A (an instance of two devices in series) A conductive foil member 110 of one photovoltaic device and a substrate 111 of another photovoltaic device adjoining thereto are connected by means of, e.g., a connecting member 112 made of copper foil, to connect the photovoltaic devices electrically in series. To connect these, for example a solder containing a flux for stainless steel may be used to carry out soldering, followed by cleaning with a solvent such as MEK (methyl ethyl ketone) to complete series connection.

When, however, it is attempted to make the above conventional solar cells large-area, not only the area is merely made larger but also the following problems may occur in respect of conversion efficiency.

(1) Since the quantity of generated electric currents becomes larger and the collector electrodes 107 become longer, the resistance loss ($i^2R$) increase to cause a decrease in conversion efficiency.

(2) Since the path length of electric currents increases when a conductive substrate having not so good conductivity such as a stainless steel substrate is used, the resistance loss ($i^2R$) increases to cause a decrease in conversion efficiency.

As a means for solving these problems, for example, U.S. Pat. No. 5,667,596 discloses a method that can deliver the electric power without any decrease in conversion efficiency even in large-area solar cells by providing at part of the conductive substrate a conductive foil member by ultrasonic welding or soldering.

In the ultrasonic welding, however, the following problems (1) to (3) should be taken into consideration, and in the soldering the following problems (4) and (5).

(1) When metals of an iron type and a copper type are welded, a difference in their lattice constants makes elements of both mix insufficiently, so that their joint strength may lower especially in the case of the ultrasonic welding that joins only the surface layers. What can be noted as its example is an instance where a copper foil member which is inexpensive and has good conductivity is welded to a photovoltaic device having a substrate of stainless steel.

(2) Since the metals are joined only at the surface layers, a low joint strength may result when the metal surfaces stand oxidized. In addition, such joint strength may further become lower in an environment of high temperature and high humidity (85° C., 85% RH) to enable no assurance of long-term reliability.

(3) Since the welding conditions must be changed depending on how the surfaces of both metals stand oxidized, the ultrasonic welding can not be said to be much suited for mass production.

(4) When heat is applied with a soldering bit, the heat may cause the substrate to deform to come to have no flatness of the photovoltaic device.

(5) The flux may be removed insufficiently even with use of a solvent, so that the device may rust in a condition having temperature and humidity. As the result, cover materials of the photovoltaic device may come off.

SUMMARY OF THE INVENTION

The present invention was made taking account of the above problems. An object of the present invention is to provide a welding process that can achieve a high reliability and a high weld strength, and a photovoltaic device formed by such a welding process.

Another object of the present invention is to provide a welding process that can bring about a good result especially on the joining between iron type metals and copper type metals, and a photovoltaic device formed by such a welding process.

The present invention provides a welding process comprising joining a semiconductor-holding member, which has at least a thin-film semiconductor layer, and a metal member by welding, wherein laser light having a wavelength where the thin-film semiconductor layer can absorb the laser light is applied on the side of the thin-film semiconductor layer. It also provides a photovoltaic device produced by this welding process.

The present invention further provides a photovoltaic device comprising a conductive substrate having a thin-film semiconductor layer, and a conductive foil member joined to at least part of the conductive substrate by welding, the thin-film semiconductor layer serving as a semiconductor active layer, wherein the conductive foil member and the conductive substrate are joined by welding them by applying laser light on the side of the thin-film semiconductor layer, the laser light having a wavelength where the thin-film semiconductor layer can absorb the laser light.

DESCRIPTION OF THE PREFERRED EMBODIMENTS

Figure 1A:
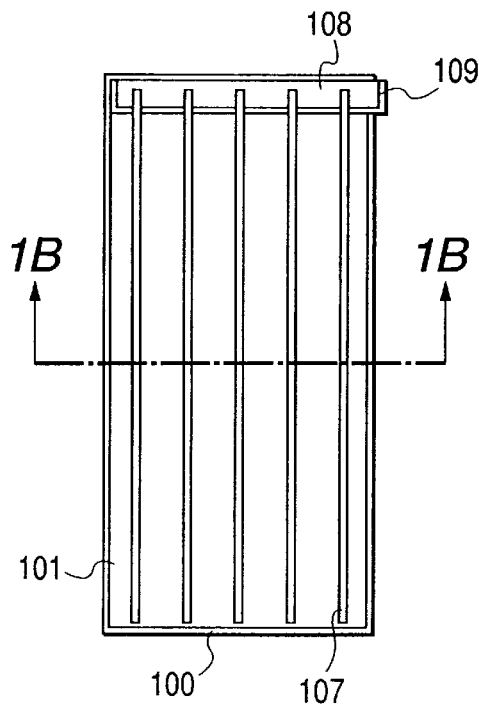
FIG. 1A is a diagrammatic plan view showing an example of the constitution of a solar cell.
Figure 1B:
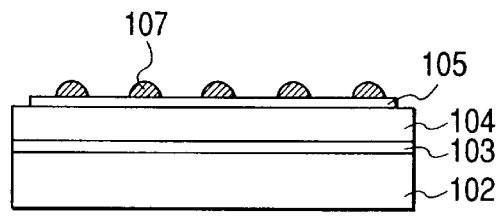
FIG. 1B is a diagrammatic cross-sectional view of the solar cell shown in FIG. 1A.
Figure 2A:
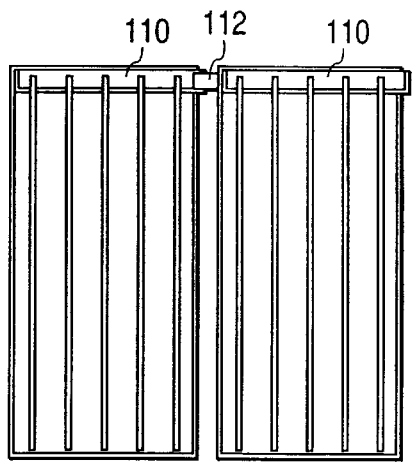
FIG. 2A is a diagrammatic plan view showing an example of the constitution of solar cells connected in series.
Figure 2B:
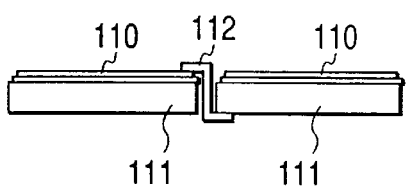
FIG. 2B is a diagrammatic cross-sectional view of the solar cells shown in FIG. 2A.

In the present invention, a semiconductor-holding member and a metal member, the former having at least a thin-film semiconductor layer, are welded by the use of laser light. The laser light is applied to a welding portion through the thin-film semiconductor layer or to the thin-film semiconductor layer at its part corresponding to the welding portion. Namely, in the present invention, the thin-film semiconductor layer which is usually formed so as to function as a device is utilized in the step of welding so that the welding can be stably carried out at a high reliability and a high strength.

The welding process of the present invention has been accomplished as a result of extensive studies made by the present inventors on a welding process by which materials can be joined at a sufficiently high strength and in a state stable for a long term especially when a metal member of the same or different type is welded to a conductive substrate which is a part of the photovoltaic device. The present invention thus made brings about the following advantages.

(1) A superior weld strength can be achieved in respect of initial weld strength and long-term stability. More specifically, when the semiconductor-holding member having a thin-film semiconductor layer and the metal member are joined, the laser light having a wavelength where the thin-film semiconductor layer can absorb light is applied on the side of the thin-film semiconductor layer, and hence part of the laser light is absorbed at the interior of the thin-film semiconductor layer. As the result, heat is generated by the absorption of light energy at the interior of the thin-film semiconductor layer and the semiconductor-holding member and metal member come to more readily melt, so that sufficient melt diffusion takes place to contribute to an improvement in the weld strength.

(2) The process can be applied to the formation of members of photovoltaic devices such as solar cells. More specifically, the thin-film semiconductor layer can be a semiconductor active layer of a photovoltaic device, the semiconductor-holding member can be a conductive substrate of the photovoltaic device and the metal member can be a conductive foil member, thus the process can be applied as a process for welding the members of the photovoltaic device.

(3) In the case where the semiconductor-holding member is an iron type and the metal member is a copper type, the improvement in weld strength can be expected to be most remarkably effective. More specifically, also in these materials which are inherently difficult to mix, the melt diffusion takes place in the direction that the strength becomes greater, on account of the action stated in the above (1).

(4) The semiconductor-holding member may comprise stainless steel, the iron type metal, and the metal member may comprise copper, where a more superior photovoltaic device can be provided. More specifically, the use of stainless steel makes it possible to provide a photovoltaic device having a high corrosion resistance and a high long-term reliability. Also, the use of copper makes it possible to provide a photovoltaic device which is inexpensive, is highly conductive and may cause less resistance loss. Especially when solder-coated copper is used as the copper, any preliminary soldering is unnecessary in the subsequent step of making series connection. Thus, steps can be lessened and also the copper can be prevented from oxidation.

(5) Since the semiconductor layer absorbs light to cause heat generation, it is unnecessary to form any additional layer for absorbing laser light, thus the steps can be simplified.

Figure 3:
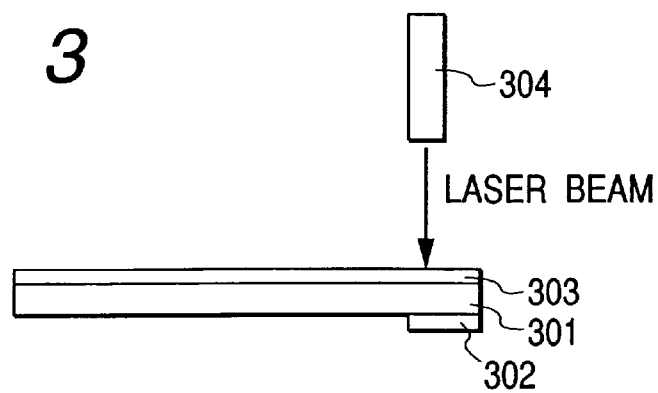
FIGS. 3, 4 and 5 are diagrammatic cross-sectional views for illustrating a welding process making use of laser light.

An embodiment of the present invention will be described below with reference to FIG. 3. In FIG. 3, reference numeral 301 denotes a semiconductor-holding member; 302, a metal member; 303, a thin-film semiconductor layer; and 304, a laser.

(Semiconductor-holding Member 301)

The semiconductor-holding member used in the present invention is a member on which the semiconductor layer 303 is mechanically supported in the case of, e.g., an amorphous-silicon thin-film solar cell, and may be used as an electrode in some cases. The semiconductor-holding member is required to have a heat resistance high enough to withstand the heating temperature at the time of forming the thin-film semiconductor layer. From an electrical viewpoint, those having a much superior conductivity are preferred.

For example, it may include thin sheets of metals such as Fe, Cu, Ni, Cr, Al, Mo, Au, Nb, Ta, V, Ti, Pt and Pb or alloy of some of these, stated specifically, brass and stainless steel, and also composite materials of these, as well as carbon sheets and galvanized steel sheets.

Of the above materials, especially when used as members of solar cells, it is preferable to use those which can fulfill the conditions of, e.g., (1) having good corrosion resistance and (2) having good electrical conductivity. In particular, it is preferable to use stainless steel which is an alloy of Fe and Cr, Ni, C or the like.

The semiconductor-holding member may have any thickness without any particular limitations so long as it is a thickness within the range where the laser light applied can pass through up to the metal member 302.

(Metal Member 302)

The metal member may include, e.g., thin sheets of metals such as Fe, Cu, Ni, Cr, Al, Mo, Au, Nb, Ta, V, Ti, Pt and Pb or alloy of some of these, stated specifically, brass and stainless steel, and also composite materials of these, as well as carbon sheets and galvanized steel sheets, any of which may be used.

Especially when used as members of photovoltaic devices, it is preferable to use those which can fulfill the conditions of, e.g., (1) having a better electrical conductivity than the semiconductor-holding member 301, (2) having a good workability and (3) being inexpensive. Of the above materials, it is preferable to use those composed chiefly of Cu.

As species of Cu, any of electrolytic copper, electrolytic tough pitch copper, oxygen-free copper and deoxidized copper may be used. Cu alloys such as brass, Silzin bronze, phosphor bronze, bronze, aluminum bronze, beryllium copper, lead bronze and nickel bronze may also be used without any problems. When the Cu alloys are used, those containing elements other than Cu in a smaller quantity are preferred.

Members comprising copper coated with other element(s) on its surface and materials clad with other element(s) are also available. For example, it is possible to use silver-coated copper, solder-coated copper, silver-clad copper and aluminum-clad copper.

The above materials may preferably be used especially when the metal member is required to be soldered in the subsequent step of making series connection.

Of these, oxygen-free copper, phosphor bronze and solder-coated copper are preferred, and solder-coated copper is particularly preferred.

As for its thickness, a larger thickness is preferable when the fact that it is a passage of electric currents and its mechanical strength are taken into account, and a smaller thickness is preferable in view of the fact that, when the connecting member has a large thickness, the interface can not be well filled with a laminating material to cause air bubbles. To balance both, stated specifically, the metal member may preferably be of a thickness from 70 to 200 $\mu$m.

(Thin-film Semiconductor Layer 303)

The thin-film semiconductor layer according to the present invention refers to a semiconductor active layer having, e.g., an i-type layer, a p-type layer and an n-type layer. Giving the amorphous silicon type solar cell as an example, semiconductor materials constituting the i-type layer may include amorphous semiconductors of what is called Group IV and Group IV alloy types such as a-Si, a-SiGe and a-SiC. Semiconductor materials constituting the p-type layer or n-type layer may include those obtained by doping with a valence electron control agent the semiconductor materials constituting the above i-type layer. As materials therefor, compounds containing a Group III element may be used as the valence electron control agent for obtaining the p-type semiconductor layer. The Group III element may include B, Al, Ga and In. Compounds containing a Group IV element may be used as the valence electron control agent for obtaining the n-type semiconductor layer. The Group V element may include P, Nl, As and Sb.

These materials are exemplified for the instance of amorphous semiconductors. These may also be used in instances where, e.g., the whole or part of the p-type layer or n-type layer has been made polycrystalline or microcrystalline.

The thin-film semiconductor layer can be formed by a known process such as vapor deposition, sputtering, RF (radio frequency) plasma enhanced CVD (chemical vapor deposition), microwave plasma enhanced CVD, ECR (electron cyclotron resonance) sputtering, thermal CVD and LPCVD (low-pressure CVD), any of which may be used as desired. Large-area layers can be obtained by a process in which a belt-like (roll type) substrate is continuously transported by a roll-to-roll system to form films.

In the present invention, for the purpose of improving spectral sensitivity and voltage, what is called the tandem cell or triple cell may be used, which have semiconductor junctions superposed in two or more layers.

(Laser 304)

The laser according to the present invention is used for the purpose of welding the semiconductor-holding member 301 and the metal member 302. Any lasers can be used as desired, so long as they emit light having an oscillation wavelength where the thin-film semiconductor layer 303 formed on the semiconductor-holding member 301 can absorb light.

As types of the layer, it may specifically include solid-state lasers such as ruby lasers, YAG lasers and $CaWO_4$ lasers, and gas-discharge lasers such as He-Ne lasers and argon lasers, any of which may appropriately be used in conformity with the constitution of the thin-film semiconductor layer.

The form of oscillations of lasers may differ depending on the type and purpose of processing, and any of pulsed oscillation and continuous oscillation can appropriately be used.

Examples of the present invention will be given below.

EXAMPLE 1

Figure 4:
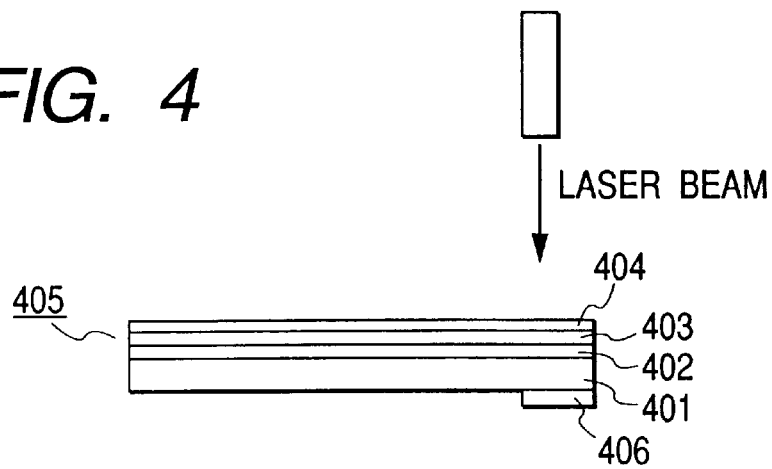

An instance where an amorphous silicon solar cell having a p-i-n junction type triple configuration, making use of a stainless steel substrate as the substrate, will be specifically described with reference to FIG. 4.

As a semiconductor-holding member 401, a surface-cleaned, 0.10 mm thick roll-type stainless steel 430BA substrate (volume resistivity: $6.0 \times 10^{-5}$ $\Omega \cdot cm$) was prepared.

On this stainless steel roll, as a lower electrode an Al layer of 1,000 angstroms thick and a ZnO film of 1 μm thick were formed in the order closer to the substrate by sputtering at a substrate temperature of 350° C.

Thereafter, the substrate thus processed was put into a microwave plasma enhanced CVD film-forming system, and an n-type layer, an i-type layer and a p-type layer were deposited in this order to form a bottom layer 402. Here, the n-type layer and p-type layer were formed of a-Si (amorphous silicon), and the i-type layer, a-SiGe (amorphous silicon germanium). Next, an n-type layer, an i-type layer and a p-type layer were deposited in this order to form a middle layer 203. The n-type layer and p-type layer were formed of a-Si like the bottom layer, and the i-type layer, a-SiGe like the bottom layer. Next, an n-type layer, an i-type layer and a p-type layer were deposited in this order to form a top layer 204. The n-type layer, p-type layer and i-type layer were each formed of a-Si.

Subsequently, as a transparent electrode also having the function to prevent reflection, an ITO (indium-tin-oxide) layer (not shown) was formed in a thickness of 700 angstroms.

The roll type stainless steel substrate on which a triple multilayer film was formed through the above process was divided into individual solar cell elements by cutting. In this way, a solar cell element 405 having a thin-film semiconductor layer having the bottom layer 402, the middle layer 403 and the top layer 404 was obtained.

Next, as a metal member 406, soft copper foil (oxygen-free copper) of 100 μm thick was prepared. This soft copper foil has a volume resistivity of $1.7 \times 10^{-6}$ Ω·cm, and has a higher conductivity than the stainless steel substrate, the semiconductor-holding member 401, even when the cross-sectional area of the copper foil is taken into account.

As a laser by means of which these semiconductor-holding member 401 and metal member 406 are welded, a pulsed Nd-YAG laser (maximum rated output: 50 W; peak output: 5 kW/10 ms) manufactured by Miyachi Technos Co. was prepared. The YAG laser emits monochromatic light with a wavelength of 1.065 μm. The light having this wavelength can be absorbed by the a-SiGe bottom i layer described above.

Upon completion of the above preparation, the solar cell element 405 and the metal member 406 were fixed on a fixing jig (not shown) such that the semiconductor-holding member 401 and the metal member 406 are made in close contact, and pulsed laser beams were emitted at an energy of about 20 J from above the side on which the thin-film semiconductor layer was formed, to carry out welding at 10 spots.

The welded sample thus produced through the steps as described above was put to measurement of peel strength by using a 180° C. peel tester to find that it was 2.2±0.5 kg. Also, the welded areas were polished to observe their cross-sectional texture on a scanning electron microscope. As a result, a texture appearing to be a mix of stainless steel and copper was seen, and good welds had been provided.

COMPARATIVE EXAMPLE 1

Figure 5:
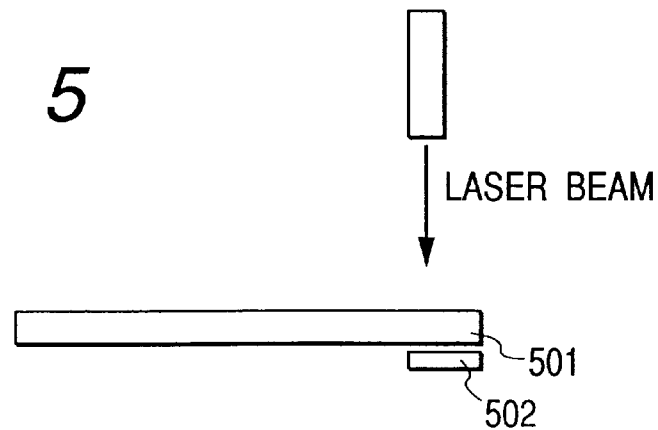

For comparison, a welded sample was produced in entirely the same manner as in Example 1 except that the thin-film semiconductor layer was not provided as shown in FIG. 5. As another exception, taking account of a possibility that the direct incidence of laser light on a metal substrate 501 may cause the sample to be affected by the reflection from stainless steel, an ITO layer (not shown) was formed on the metal substrate 501 in a thickness of 700 angstroms as a transparent electrode also having the function to prevent reflection.

The welded sample thus produced through the steps as described above was put to measurement of peel strength by using a 180° C. peel tester to find that it was 1.7±0.5 kg. Also, the welded areas were polished to observe their cross-sectional texture on a scanning electron microscope. As a result, the part of stainless steel and the part of copper were seen completely separate.

As can be seen from the above results, a superior weld can be provided and the weld strength can be improved, when welded in the presence of the thin-film semiconductor layer.

EXAMPLE 2

In the present Example, a welded sample was produced in entirely the same manner as in Example 1 except that a phosphor bronze member was used as the metal member 406 and the oscillation energy of the laser was changed to 25 J. The phosphor bronze member used was in a thickness of 200 μm and was formed of hard phosphor bronze.

The welded sample thus produced through the steps as described above was put to measurement of peel strength by using a 180° C. peel tester to find that it was 2.1±0.5 kg. The cross-sectional texture was also observed. As a result, like Example 1, a texture appearing to be a mix of stainless steel and copper was seen, where good welds had been provided.

COMPARATIVE EXAMPLE 2

For comparison, a welded sample was produced in entirely the same manner as in Example 2 except that the thin-film semiconductor layer was not provided. As another exception, like Comparative Example 1, an ITO layer (not shown) was formed on the metal substrate 501 in a thickness of 700 angstroms as a transparent electrode also having the function to prevent reflection.

The welded sample thus produced through the steps as described above was put to measurement of peel strength by using a 180° C. peel tester to find that it was 1.3±0.4 kg. Also, the welded areas were polished to observe their cross-sectional texture on a scanning electron microscope. As a result, like Comparative Example 1, the part of stainless steel and the part of copper were seen completely separate.

As can be seen from the above results, there is a remarkable difference in whether the thin-film semiconductor layer is present or absent, even when phosphor bronze is used.

EXAMPLE 3

In the present Example, a welded sample was produced in entirely the same manner as in Example 1 except that a solder-coated copper member was used as the metal member 406. The solder-coated copper member used was in a thickness of 100 μm and was coated with solder in a thickness of 2 μm on each side.

The welded sample thus produced through the steps as described above was put to measurement of peel strength by using a 180° C. peel tester to find that it was 2.2±0.5 kg, which was substantially the same result as in Example 1. The cross-sectional texture was also observed. As a result, like Example 1, a texture appearing to be a mix of stainless steel and copper was seen.

COMPARATIVE EXAMPLE 3

For comparison, a welded sample was produced in entirely the same manner as in Example 3 except that the thin-film semiconductor layer was not provided. As another exception, like Comparative Example 1, an ITO layer (not shown) was formed on the metal substrate 501 in a thickness of 700 angstroms as a transparent electrode also having the function to prevent reflection.

The welded sample thus produced through the steps as described above was put to measurement of peel strength by using a 180° C. peel tester to find that it was 1.5±0.4 kg. Also, the welded areas were polished to observe their cross-sectional texture on a scanning electron microscope. As a result, like Comparative Example 1, a texture wherein the part of stainless steel and the part of copper were separate was seen.

As can be seen from the above results, there is a remarkable difference in whether the thin-film semiconductor layer is present or absent, even when solder-coated copper is used.

EXAMPLE 4

With regard to the samples produced in the above Examples 1 to 3 and Comparative Examples 1 to 3, their reliability as solar cell members was confirmed according to the temperature-humidity cycle test A-2 prescribed in JIS C8917 as an environmental test method and durability test method on crystal type solar cell modules. More specifically, the samples were put into a temperature humidity controllable thermo-hygrostat to repeatedly make cycle tests 100 times while changing the temperature from −40° C. to +85° C. (relative humidity).

The samples having been thus tested were put to measurement of peel strength by using a 180° C. peel tester in the same manner as the measurement of initial strength. Results obtained are shown in Table 1 together with those of the initial peel strength.

TABLE 1

| | (kg) | |
|---|---|---|
| | Initial peel strength | Peel strength after test |
| | Example: | |
| 1 | 2.2 | 2.3 |
| 2 | 2.1 | 2.2 |
| 3 | 2.2 | 2.1 |
| | Comparative Example: | |
| 1 | 1.7 | 1.5 |
| 2 | 1.3 | 1.0 |
| 3 | 1.5 | 1.2 |

As can be seen from the above results, with regard to the samples of Examples 1 to 3, in which the welding is carried out in the state the thin-film semiconductor layer has been formed, changes are little seen in the peel strength after the test compared with the initial strength. On the other hand, with regard to the samples of Comparative Examples 1 to 3, in which the thin-film semiconductor layer is not formed, not only the initial peel strength is lower than that of Examples 1 to 3 but also a lowering of peel strength by 0.2 to 0.3 kg is seen after the test. Regarding the cause, this is considered due to the incomplete manner of mixing of the two metals by welding, which has caused invasion of water into the gaps or the like between crystal grains to have tended toward the progress of peeling.

As described above, the present invention can achieve a higher weld strength than ever, and has been found to be remarkably effective especially in the iron-copper welding. The present invention also makes it possible to provide a sufficiently reliable photovoltaic device.

What is claimed is:

1. A welding process for joining a semiconductor-holding member and a metal member, said process comprising the steps of:
   forming a thin-film semiconductor layer on the semiconductor holding member; and
   applying a laser light having a wavelength where the thin-film semiconductor layer can absorb the laser light on a side of the thin-film semiconductor layer.

2. The welding process according to claim 1, wherein the semiconductor-holding member is a conductive substrate of a photovoltaic device and the metal member is a conductive foil member.

3. The welding process according to claim 1, wherein the thin-film semiconductor layer is the same layer as a semiconductor active layer of a photovoltaic device.

4. The welding process according to claim 1, wherein the semiconductor-holding member is composed chiefly of iron and the metal member is composed chiefly of copper.

5. The welding process according to claim 1, wherein the semiconductor-holding member comprises stainless steel and the metal member comprises copper.

6. The welding process according to claim 1, wherein the metal member comprises solder-coated copper.

7. The welding process according to claim 1, wherein the thin-film semiconductor layer comprises a non-single-crystal semiconductor.

8. A process for producing a photovoltaic device using the welding process of claim 1.

9. A process for producing a photovoltaic device comprising a thin-film semiconductor layer for conducting a photoelectric conversion, a semiconductor-holding member for holding the thin-film semiconductor layer and a metal member electrically connected to the semiconductor-holding member, comprising the steps of:
   forming the thin-film semiconductor layer on the semiconductor-holding member;
   applying, from the side of the thin-film semiconductor layer to the side of the semiconductor-holding member, a laser light having a wavelength where the thin-film semiconductor layer can absorb the laser light to join the semiconductor-holding member and the metal member.

10. The process for producing a photovoltaic device according to claim 9, wherein the joining is conducted by welding.

11. The process for producing a photovoltaic device according to claim 9, wherein the semiconductor-holding member is a conductive substrate.

12. The process for producing a photovoltaic device according to claim 9, wherein the semiconductor-holding member is mainly composed of iron, and the metal member is mainly composed of copper.

13. The process for producing a photovoltaic device according to claim 12, wherein the semiconductor-holding member comprises stainless steel.

14. The process for producing a photovoltaic device according to claim 12, wherein the metal member comprises copper.

15. The process for producing a photovoltaic device according to claim 9, wherein the metal member is covered with a solder-plating.

16. The process for producing a photovoltaic device according to claim 15, wherein the solder-plating is conducted on copper.

17. The process for producing a photovoltaic device according to claim 9, wherein the thin-film semiconductor layer comprises a non-monocyrstalline semiconductor material.

* * * * *

UNITED STATES PATENT AND TRADEMARK OFFICE
CERTIFICATE OF CORRECTION

PATENT NO. :  6,114,185

DATED       :  September 5, 2000

INVENTOR(S):  KOJI TSUZUKI, ET AL.

It is certified that error appears in the above-identified patent and that said Letters Patent is hereby corrected as shown below:

COLUMN 2:

Line 6, "adhesives." should read --adhesive.--.
Line 21, "of" should read --of a--.

COLUMN 10:

Line 64, "non-monocyrstalline" should read --non-monocrystalline--.

Signed and Sealed this

First Day of May, 2001

Attest:

NICHOLAS P. GODICI

*Attesting Officer*    *Acting Director of the United States Patent and Trademark Office*